United States Patent
Lee et al.

(10) Patent No.: US 6,194,727 B1
(45) Date of Patent: Feb. 27, 2001

(54) DIRECT RADIOGRAPHIC IMAGING PANEL HAVING A DIELECTRIC LAYER WITH AN ADJUSTED TIME CONSTANT

(75) Inventors: Denny L. Y. Lee, West Chester, PA (US); James E. Davis, Wilmington, DE (US)

(73) Assignee: Direct Radiography Corp., Newark, DE (US)

( * ) Notice: Subject to any disclaimer, the term of this patent is extended or adjusted under 35 U.S.C. 154(b) by 0 days.

(21) Appl. No.: 09/110,549

(22) Filed: Jul. 6, 1998

(51) Int. Cl.⁷ .............................. G01T 1/24; H01L 31/18
(52) U.S. Cl. .......................................... 250/370.09
(58) Field of Search ......................... 250/370.09

(56) References Cited

U.S. PATENT DOCUMENTS

| | | |
|---|---|---|
| 2,753,278 | 7/1956 | Bixby et al. . |
| 5,262,649 | 11/1993 | Antonuk et al. . |
| 5,319,206 | 6/1994 | Lee et al. . |
| 5,381,014 | 1/1995 | Jeromin et al. . |
| 5,563,421 | 10/1996 | Lee et al. . |
| 5,641,974 | 6/1997 | Den Boer et al. . |
| 5,648,660 | 7/1997 | Lee et al. . |
| 5,661,309 | 8/1997 | Jeromin et al. . |
| 5,729,021 | 3/1998 | Brauers et al. . |

OTHER PUBLICATIONS

"The Physics of a New Direct Digital X–ray Detector" by D.L. Lee, L.S. Jeromin, L.K. Cheung. Proceedings CAR, 1995, Springer–Verlag, Berlin, pp. 83–88.

"Linear Segmented Polyurethane Electrolytes–II. Conductivity and Related Properties" by A.W. McLennaghan A. Hooper, R.A. Pethrick. Eur. Polym. J. vol. 25, pp. 1297–1302. Pergamon Press, 1989.

*Primary Examiner*—Constantine Hannaher
(74) *Attorney, Agent, or Firm*—Ratner & Prestia

(57) ABSTRACT

A panel for radiation detection having a plurality of sensors arrayed thereon. Each sensor includes a charge storage capacitor, a radiation sensitive layer over the charge storage capacitor and a dielectric layer over the radiation sensitive layer. The dielectric layer has an adjusted resistivity resulting in a time constant $\tau = \rho \kappa \epsilon_0$ between 0.050 and 20 seconds, wherein $\kappa$ is the dielectric constant of the dielectric layer, and $\epsilon_0$ is the permitivity of free space. The radiation detection layer is a photoconductor, and the dielectric layer is, preferably, a linear segmented polyurethane.

8 Claims, 2 Drawing Sheets

DIRECT RADIOGRAPHIC IMAGING PANEL HAVING A DIELECTRIC LAYER WITH AN ADJUSTED TIME CONSTANT

BACKGROUND OF THE INVENTION

1. Field of the Invention

This invention relates to radiation sensors in general and more particularly to a radiation detection panel comprising a plurality of radiation sensors which include a dielectric layer with adjusted resistivity.

2. Description of Related Art

Radiation sensors able to convert incident radiation directly to an electrical charge indicative of the intensity of the incident radiation are known. Typically such sensors comprise a complex structure which includes a bottom and a middle conductive electrode separated by a dielectric to form a charge storing capacitor. A radiation detection layer, which may be a photoconductive layer, is placed over one of the electrodes. Over the photoconductive layer is another dielectric layer and a top electrode over the dielectric layer completes the sensors structure. Charge blocking layers are often provided between the conductive electrodes and the photoconductive layer.

A charging voltage is applied between the top electrode and the bottom capacitor plate.

Upon exposure to radiation, a charge proportional to the exposure level accumulates in the storage capacitor formed by the bottom and middle electrodes. Read-out of the stored charge is usually done by addressing the middle electrode and flowing the capacitor charge to a charge measuring device such as a charge integrating amplifier.

A plurality of such sensors may be assembled in an array of rows and columns to form a radiation detection panel. By sequentially reading out the charges accumulated in the individual sensors an image of the relative exposure of different areas of the panel is obtained. This image represents the radiation intensity incident on the panel after it has passed through a subject illuminated by the radiation. When the radiation is X-ray radiation and the subject is a patient the resulting image is a radiogram, captured as a plurality of charges. This radiogram can be displayed on a Cathode ray tube or other device for viewing.

The charge stored in the capacitor is read-out using a switch which connects, upon command, the middle electrode to the input of the charge measuring device. In practice such switch is usually an FET transistor created integrally with the sensor, having its source electrode connected directly to the middle electrode of the sensor. Both the drain electrode and the gate are accessible from outside the sensor. The drain is connected to the charge integrator. An electrical signal applied to the gate switches the transistor to a conductive state and permits the charge to flow from the capacitor to the integrator for detection.

The above described technology is well known in the art and well described in a number of publications and issued patents, exemplary of which is U.S. Pat. No. 5,319,206 issued Jun. 7, 1994 to Lee et al., and in an article by Denny L. Lee, Lawrence K. Cheung and Lothar S. Jeromin, entitled "The Physics of a new direct digital X-ray detector" appearing in the Proceedings CAR '95, Springer-Verlag, Berlin, pp. 83. Both the patent and the article are incorporated herein by reference.

The simplified sensor and transistor structure described above, while quite adequate, is, however, vulnerable to overexposure. The term "exposure" is used in this specification to designate the product of the intensity of the incident radiation times the time during which the radiation impinges on the sensor.

When the detector is exposed to radiation, electron-hole pairs are generated in the radiation detection layer which, under the influence of the electric field produced by the applied charging voltage, travel toward the top and middle electrodes respectively. If such charges are allowed to flow freely, the charge stored in the capacitor formed between the middle and bottom electrodes increases continuously. The result of such continuous charge increase is an associated voltage increase on the voltage appearing on the middle electrode which will eventually result in the catastrophic failure of the associated transistor switching element connected to the charge storage capacitor. The presence of a dielectric layer between the radiation detection layer and the top electrode eliminates this risk by presenting a barrier to the migrating charges, which begin accumulating in the interface between the radiation detection layer and the dielectric layer. These accumulated charges set up a secondary field opposing the applied charging field thus inhibiting further charge migration and providing a limit to the rising voltage on the middle electrode.

While this is an acceptable solution to the overexposure problem, the accumulated charges on the dielectric/photoconductor interface will interfere with subsequent exposures of the sensor. In order to eliminate the effect of such residual charges, there is usually required an additional step in which the trapped charges are eliminated. This extra step is not only time consuming, but, for the reasons discussed later, inhibits the use of this type of sensor for continuous, real time imaging, such as in fluoroscopy applications.

It is an object, therefore, of the present invention to provide a sensor, and an associated panel comprising a plurality of such sensors, which is protected from catastrophic failure due to overexposure during single exposure operation, and which still has fast response for use in real time viewing applications.

SUMMARY OF THE INVENTION

The aforementioned objectives are achieved by a radiation sensor according to this invention which comprises:

a) a charge storage capacitor;

b) a radiation sensitive layer over said charge storage capacitor;

c) a dielectric layer over said radiation sensitive layer said dielectric layer having a time constant $\tau = \rho \kappa \epsilon_0$ selected between 0.05 and 20 seconds, wherein p is the resistivity, $\kappa$ is the dielectric constant of the dielectric layer, and $\epsilon_0$ is the permitivity of free space; and d) a top conductive layer over said dielectric layer.

The invention further comprises a method for forming a radiation detection sensor of the type comprising:

a) a charge storage capacitor;

b) a radiation sensitive layer over said charge storage capacitor;

c) a dielectric layer over said radiation sensitive layer; and d) a top conductive layer over said dielectric layer.

the method comprising adjusting the resistivity $\rho$ of the dielectric layer such that a time constant $\tau = \rho \kappa \epsilon_0$ is set between 0.05 and 20 seconds, $\kappa$ being the dielectric constant of the dielectric layer.

The dielectric layer may be a linear segmented polyurethane in which the resistivity p has been so adjusted.

Finally, the invention also includes a radiation detection panel comprising a plurality of radiation sensors, each of said sensors including:

a) a charge storage capacitor;

b) a radiation sensitive layer over said charge storage capacitor;

c) a dielectric layer over said radiation sensitive layer said dielectric layer having a time constant $\tau=\rho\kappa\epsilon_0$ selected between 0.05 and 20 seconds, wherein $\rho$ is the resistivity and $\kappa$ is the dielectric constant of the dielectric layer; and d) a top conductive layer over said dielectric layer.

Preferably, $\tau$ is around 1 second.

BRIEF DESCRIPTION OF THE DRAWINGS

The invention can be more fully understood from the following description thereof in connection with the accompanying drawings described as follows.

DESCRIPTION OF THE PREFERRED EMBODIMENT(S)

Figure 1:
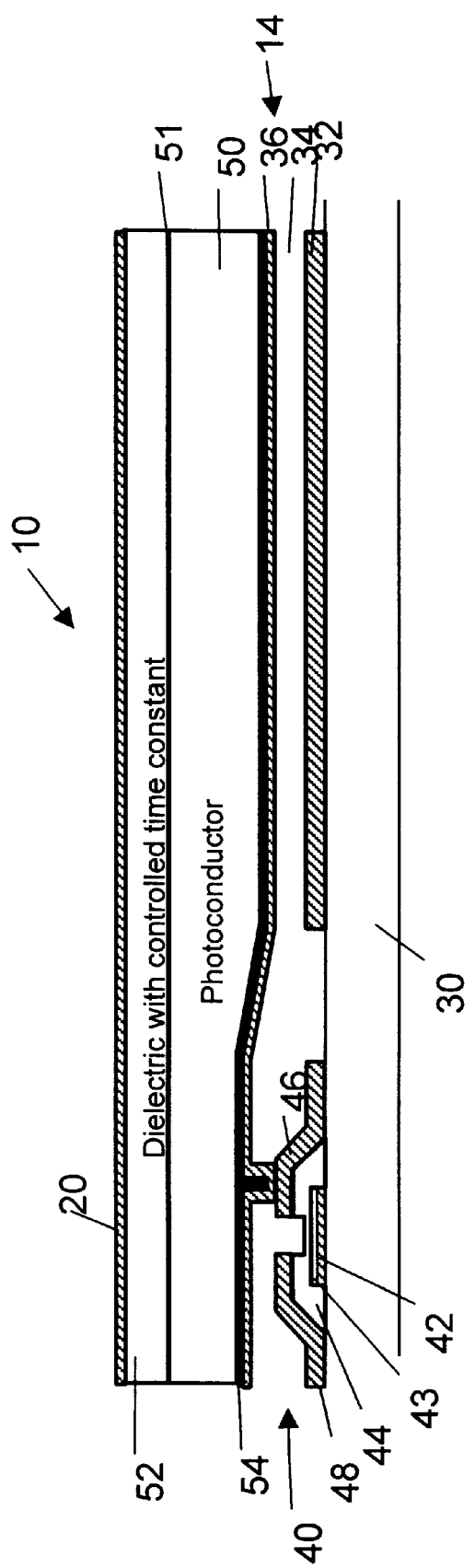
FIG. 1 is a representation of a radiation sensor in accordance with the present invention.

Throughout the following detailed description, similar reference characters refer to similar elements in all figures of the drawings.

Referring now to FIG. 1, there is shown in a schematic elevation the internal structure of a sensor 10 according to this invention. The sensor is built on a substrate 30 which may be glass, ceramic, or other suitable insulating material which provides enough mechanical strength to support the layers and circuitry comprising the sensor.

Also shown are two conductive elements, placed adjacent each other to form a first or bottom conductive microplate 32, and a second conductive microplate 36. A dielectric layer 34 is placed between the two microplates to form charge accumulating capacitor 14. The conductive elements may be thin layers of a conductive material such as indium-tin-oxide, or a thin layer between 50A and 100A of metal.

An FET transistor 40 is also built on substrate 30. Such transistor preferably comprises a gate electrode 42, a semiconductor 43 which is typically $\alpha$Si, a contact layer 44, typically an $\alpha$+Si layer, a source electrode 46 and a drain electrode 48. The source electrode 46 is connected to the second conductive microplate 36 and the drain electrode 48 is connected to a conductor leading to a contact for connecting the FET 40 to a charge detector. The technology for making arrays of FET transistors connected to arrays of microplates is well known. (U.S. Pat. No. 5,641,974 issued to den Boer et al. discloses in detail the structure and process of making such a transistor.)

A radiation detection layer which is typically a photoconductive layer 50, and which preferably exhibits very high dark resistivity overlays the previously deposited layers. In radiography, particularly in medical applications, the incident radiation is X-ray radiation, and the radiation detection layer is an X-ray photoconductor. The photoconductive layer may comprise amorphous selenium, lead iodide, lead oxide, thallium bromide, cadmium telluride, cadmium sulfide, mercuric iodide or any other such material. It may comprise organic materials such as polymers which may be loaded with X-ray absorbing compounds which exhibit photoconductivity when the captured radiation is X-ray radiation.

In a preferred embodiment, this layer is a continuous amorphous selenium layer 300 to 500 micrometers thick.

A dielectric layer 52 is placed over the photoconductive layer and a conductive top electrode 20 is placed over the dielectric layer. Top electrode 20 is preferably a layer of indium-tin-oxide; other conductive material such as chromium, aluminum, etc. may be used. The top electrode should be selected so that it is substantially transparent to the radiation one wishes to detect. When such radiation is X-ray radiation the top electrode is preferably a conductive layer which is highly penetrable by such radiation. A thin layer 54 which may be either a unidirectional charge blocking layer permitting passage of one type of charge and not another, i.e. either negative charges or positive, between the second microplate and the photoconductor, or an insulating layer which permits no charge flow between the microplate and the photoconductor, is placed between the second microplate and the photoconductive layer. Such unidirectional charge blocking layers are well known in the art, and are typically, a non-conductive oxide created on the microplate surface facing the photoconductor. Co-pending application Ser. No. 08/987,485 assigned to assignee of the present invention the specification of which is hereby incorporated herein by reference, teaches the use of an insulating layer rather than a unidirectional blocking layer.

The technology for creating the sensors is preferably vacuum deposition of alternating layers of conductive, dielectric and insulating materials, and is well known in the art. See for instance "Modular Series on Solid State Devices" Volume 5 of Introduction to Microelectronics Fabrication by R. C. Jaeger, published by Addison-Wesley in 1988.

Not illustrated is a programmable power supply for applying a charging voltage to the sensor. The power supply is connected to the top electrode 20 and the bottom microplate 32 of the storage capacitor.

Figure 2:
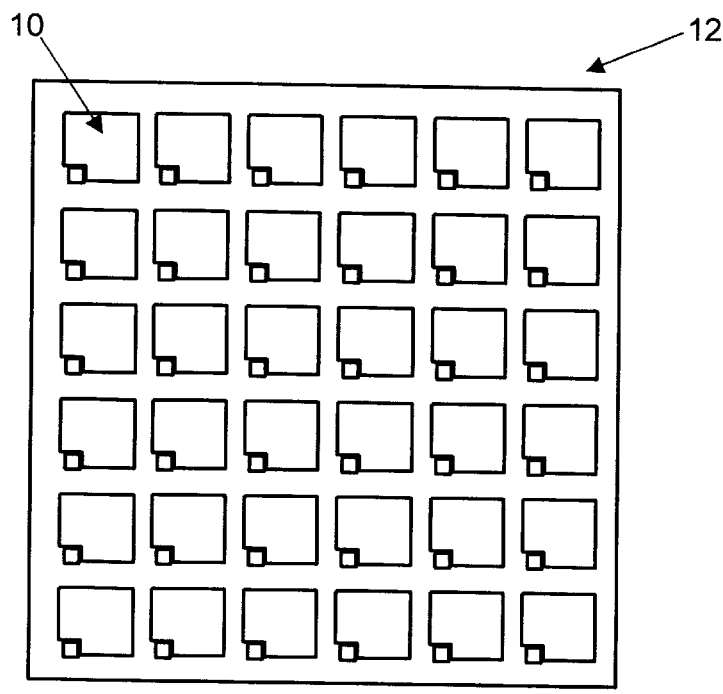
FIG. 2 shows a panel comprising a plurality of sensors of the type shown in FIG. 1.

Referring now to FIG. 2, a plurality of sensors 10 may be arrayed on a supporting structure 12 to provide an imaging panel capable of capturing radiation produced images. Such a panel may be made as a single unit or may be a composite of a plurality of smaller panels to achieve a desired size. U.S. Pat. No. 5,381,014 issued to Lee et al. on Oct. 8, 1996 discloses a technique for making larger panels using smaller units.

Figure 3:
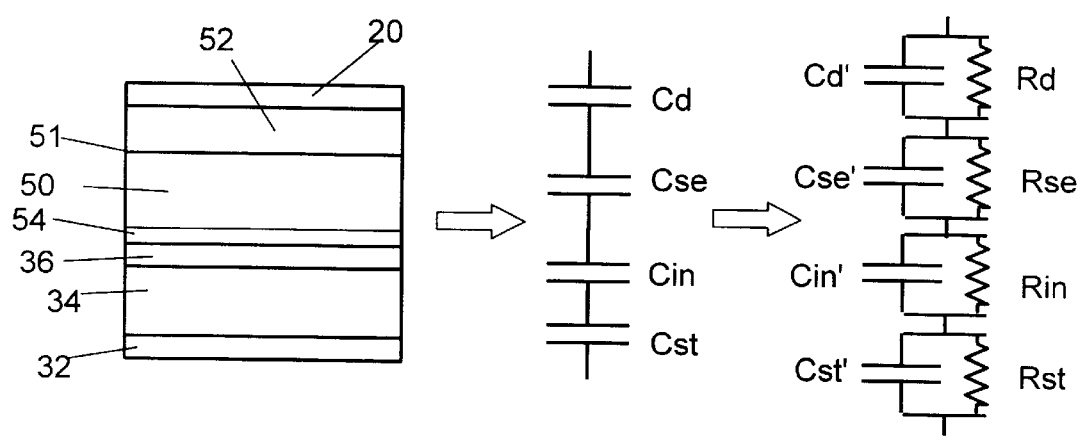
FIG. 3 shows a simplified electrical equivalent circuit of the sensor of this invention.

As illustrated in FIG. 3, the multilayer structure comprising the detector forms a number of capacitors all connected in series. In the case where the detector includes an insulating layer, there are four primary capacitors connected in series, Cd, Cse, Cin and Cst. Cd is the capacitor formed by the top electrode 20 and the radiation detection layer top surface 51 and includes the dielectric layer 52 separating the top electrode from the radiation detection layer. Cse is the capacitor formed by the top surface 51 of the radiation detection layer 50, and the insulating layer 54; Cin is the capacitor formed by the interface between radiation detection layer 50 and insulating layer 54; Cst is the storage capacitor formed by the middle and bottom microplates 36 and 32 respectively.

As disclosed in the aforementioned article by Lee et al. the capacitor values are optimized such that a 10 V/micron field is initially applied across the radiation detection layer.

FIG. 3 shows an electrical equivalent of a sensor, in which the capacitors Cd, Cse, Cin and Cst are represented each as a pure capacitor Cd', Cse', Cin' and Cst' each connected in parallel with a resistance Rd, Rse, Rin and Rst. For purposes of this invention we are interested primarily in capacitor Cd.

Capacitor Cd is represented by an equivalent circuit of a capacitor in parallel with a resistor, and has associated with it time constant τ.

(1) $\tau = RdCd'$.

Where:
(a) $Rd = \rho L/A$ and ρ represents the resistivity of the dielectric layer 52 in the capacitor; "A" represents the area of the second electrode, and "L" is the dielectric layer thickness; and
(b) $Cd' = \kappa\epsilon_0 A/L$ and κ is the dielectric constant of the material, $\epsilon_0 8.85 \times 10^{-14}$ bfarad/centimeter eing the permitivity of free space. (κ=1 for vacuum).

By substitution of (a) and (b) in (1), is seen that:

(2) $\tau = \rho\kappa\epsilon_0$.

Therefore the time constant associated with the dielectric layer is dependent on the resistivity ρ of the dielectric material, and that this time constant can be adjusted by varying the resistivity of the dielectric.

In operation, upon exposure to radiation, electron-hole pairs are generated in the radiation detection layer. When the charging voltage applied to the top electrode is positive, electrons drift toward the photoconductor/dielectric interface and are collected there, establishing a reverse field in the photoconductor. This reverse field opposes the applied field and eventually grows to the point where further charge migration is stopped.

The charges trapped in the interface between the dielectric and radiation detecting layers are not permanently trapped there, but eventually dissipate, flowing through the RdCd' circuit at a rate determined by the circuit time constant τ:

By changing the resistivity p of the dielectric material, τ may be adjusted and consequently the time for the charges accumulated on the interface between the radiation detector and the dielectric to dissipate, can also be adjusted.

As stated earlier, a plurality of radiation detection sensors arrayed on a support are used to create a panel to capture an image. Each of the detectors forms a PIXEL, or picture element. The panel is first charged by applying a charging voltage between the top electrode and the bottom microplates. It is then exposed to radiation which carries image information as a modulated intensity. The radiation impinges on the panel for a preset duration, and charges proportional to the radiation intensity are generated and stored in the storage capacitors. Appropriate signal processing, (preferably of the type disclosed in U.S. Pat. No. 5,648,660 issued to Lee et al.) is used to recover the accumulated charges in all of the storage capacitors in the detectors in the panel and to reconstruct a visible image.

In medical radiology there are two vastly different applications and associated modes of operating an imaging panel for capturing X-ray generated images. These are what would be termed (a) single shot imaging to produce still pictures, and (b) real time continuous exposure imaging for real time continuous image observation.

The first kind of imaging is generally referred to as radiography, and involves the taking of single exposure still pictures known as radiograms. Exposures are short, typically a few milliseconds, often as few as 0.002 sec. and the intensity of the radiation is high.

The second method requires a continuing image capture and display, usually in real time, generally known as fluoroscopy. In this instance the radiation exposure is relatively long and the radiation levels low. Exposures of a few minutes are common, and the display consists of the real time display of a plurality of sequentially obtained images from the panel. Images may be displayed as rapidly as 30 images per second to create the visual impression of motion. In such applications the individual charge storage capacitors are read out and discharged as frequently as every 0.020 to 0.100 sec.

As mentioned before, in the case of radiograms, because the capacitors are not discharged until the exposure is over, it is possible that high exposure levels will raise the voltage in the middle electrode to a point where the switching element can be damaged. Thus it is desirable to encourage charge build up at the interface of the photoconductor and dielectric which above produces a counter biasing field and thus limits the charge accumulation in the storage capacitor preventing excessive voltages from developing and damaging the switching element. Therefore in a panel useful for still picture capture, the dielectric layer desirably has a long time constant τ associated with it.

On the other hand, in fluoroscopic applications the radiation intensity is low and the storage capacitors are repeatedly discharged during readout. This readout repeats every few milliseconds preventing excessive charge accumulation and resulting switching element damage.

In both applications, it is desirable to obtain an image free of artifacts. This requirement means that before a subsequent imaging exposure occurs, any biasing field created by the charges trapped in the interface between the photoconductor and the dielectric must be either non existent, or at least substantially uniform and constant over the full area of the panel.

This, in turn, also means that between exposures, the charge in the interface between the photoconductor and the dielectric layers must either dissipate completely, or, more realistically, rise rapidly to a uniform level and remain substantially constant thereafter.

For a panel intended to be used in radiographic applications where single shot images are obtained every few minutes or so, a dielectric with a time constant of the order of seconds and possibly as long as 20 seconds is used, to provide the needed overexposure protection. Given sufficient time between exposures, the trapped charges will dissipate. Given sufficient time between exposures, one can also use other methods to assure the dissipation of charges and elimination of prior exposure artifacts, such as flooding the panel with light, as disclosed in U.S. Pat. No. 5,563,421 issued to Lee et al. on Oct. 8, 1996.

For a panel useful for fluoroscopic applications time constants as low as a few milliseconds are desirable to assure almost complete dissipation of the accumulated charges at the interface between readouts. Time constants of 50 milliseconds or shorter, may thus be called for.

It is now possible to produce a dual purpose panel which is useful in both types of medical radiography, by adjusting the dielectric material time constant to about one second. Such time constant permits the charges trapped in the interface to dissipate rapidly during long, fluoroscopic type imaging, yet it is long enough relative to the short, radiographic exposures used in single shot imaging to provide the needed charge build-up which prevents damage to the transistor due to voltage build-up in the charge storage capacitor.

A dielectric material which is useful for use in a dielectric layer according to this invention is linear segmented polyurethane modified by polyethylene glycol as disclosed in the article by Allan W. McLennaghan, Alan Hooper and Richard A. Pethrick entitled "LINEAR SEGMENTED POLYURETHANE ELECTROLYTES-II. CONDUCTIVITY AND RELATED PROPERTIES" published in 1989 in Eur. Polym. J. vol 25 pp 1297–1302 by Pergamon Press plc. The contents of this article are incorporated herein by reference.

Example

A panel useful for both radiographic and fluoroscopic examinations, comprising an array of a plurality of detectors was constructed by depositing an array of a plurality of first microplates on a glass substrate and by building a TFT switching transistor in a space adjacent each of the microplates. Connecting leads, as needed, were placed between the microplates connecting the drain and gates of the TFT to connection points along the panel sides. Additional leads were placed to provide electrical access to the first microplates. A dielectric layer was placed over the plurality of first microplates, leads and TFTs, and a second plurality of microplates was deposited thereover to produce a TFT module. A passivation layer was created over the middle microplate to act as a unidirectional charge blocking layer and prevent direct electrical contact between the microplate and the photoconductive layer to be coated thereon. Finally the TFT source electrode was connected to the middle microplate.

In practice, the TFT modules are fabricated using technology for microfabrication of the transistors and capacitors which is well known in the art. See, for example, the aforementioned U.S. Pat. No. 5,641,974 and the references referred to therein.

A radiation detection layer of Selenium photoconductor was next applied to the TFT module using conventional vacuum deposition techniques.

Apparatus and techniques for vacuum deposition are well known to those skilled in the art. Vacuum deposition techniques are described, for example, in the Handbook of Deposition Technologies for Films and Coatings, 2nd. Ed., R. F. Bunshah, Ed., Noyes Publications, Park Ridge, N.J., 1994. Physical vacuum deposition of selenium is described, for example, in Bixby, U.S. Pat. No. 2,753,278.

Over the Selenium photoconductor was next coated a dielectric layer using blade coating, dip coating, or spin coating. The dielectric material was linear polyurethane whose resistivity was adjusted by incorporating polyethylene glycol to achieve $\rho=3.76\times10^{12}$ Ohm-cm. With $\kappa=3$ and $\epsilon_0=8.85\times10^{-14}$ F/cm, the resulting time constant is about 1 second.

The dielectric layer was coated over the selenium layer to a thickness of 40 microns. A top conductive electrode was placed over the dielectric layer by depositing a thin layer of metal over the dielectric to complete the panel.

Those skilled in the art having the benefit of the teachings of the present invention as hereinabove set forth, can effect numerous modifications thereto. These modifications are to be construed as being encompassed within the scope of the present invention as set forth in the appended claims.

We claim:

1. A method for forming a radiation detection sensor comprising:

a) a charge storage capacitor;

b) a radiation sensitive layer over said charge storage capacitor;

c) a dielectric layer over said radiation sensitive layer;

d) a top conductive layer over said dielectric layer; and a e) a switch connected to the charge storage capacitor;

the method comprising:

A) adjusting a resistivity $\rho$ of a dielectric material to $\rho=\tau/\kappa\epsilon_0$ where $\tau$ is between 0.050 and 20 seconds, $\kappa$ is the dielectric constant of the dielectric material, and $\epsilon_0$ is the permitivity of free space;

B) forming said charge storage capacitor on a substrate;

C) forming said radiation sensitive layer over said storage capacitor; and

D) applying said dielectric material whose resistivity $\rho$ is adjusted in step (A) over said radiation sensitive layer to form said dielectric layer.

2. The method according to claim 1 wherein the dielectric material comprises a linear segmented polyurethane.

3. The method according to claim 1 wherein the dielectric material comprises a linear segmented polyurethane containing ethylene glycol.

4. The method according to claim 1 wherein $\tau$ is between about 0.050 seconds and 20 seconds.

5. The method according to claim 1 wherein $\tau$ is about 1 second.

6. A radiation detection sensor comprising a) a charge storage capacitor;

b) a radiation detection layer over said charge storage capacitor, c) a dielectric layer over said radiation sensitive layer comprising linear segmented polyurethane having an adjustable resistivity p adjusted to $\rho=\tau/\kappa\epsilon_0$ where $\tau$ is between 0.050 and 20 seconds, $\kappa$ is the dielectric constant of the dielectric material, and $\epsilon_0$ is the permitivity of free space; and d) a top conductive layer over said dielectric layer.

7. The radiation detection sensor according to claim 6 wherein the dielectric layer material is a linear segmented polyurethane containing polyethylene glycol.

8. The radiation detection sensor according to claim 7 wherein $\tau$ is between about 0.50 sec and 20 second.

* * * * *